United States Patent [19]

Sullivan

[11] Patent Number: 4,610,941
[45] Date of Patent: Sep. 9, 1986

[54] METHOD FOR PHOTOGRAPHICALLY IMPROVING THE RESOLUTION OF SCREEN PRINTED PHOTOPOLYMER IMAGES

[76] Inventor: Donald F. Sullivan, 115 Cambridge Rd., King of Prussia, Pa. 19406

[21] Appl. No.: 713,550

[22] Filed: Mar. 19, 1985

[51] Int. Cl.$^4$ ............................................. G03C 5/00
[52] U.S. Cl. .................................... 430/6; 101/129; 430/280; 430/308; 430/309; 430/312; 430/313; 430/328; 430/331
[58] Field of Search ............... 101/129; 430/6, 280, 430/308, 309, 312, 313, 328, 331

[56] References Cited

U.S. PATENT DOCUMENTS

| | | | |
|---|---|---|---|
| 4,260,675 | 4/1981 | Sullivan | 430/315 |
| 4,324,815 | 4/1982 | Mitani et al. | 101/129 |
| 4,436,806 | 3/1984 | Rendulic et al. | 430/311 |
| 4,528,261 | 7/1985 | Hauser | 430/322 |
| 4,548,895 | 10/1985 | Irving et al. | 430/280 |

FOREIGN PATENT DOCUMENTS 1353583  5/1974  United Kingdom ............. 430/328

*Primary Examiner*—John E. Kittle
*Assistant Examiner*—Patrick J. Ryan
*Attorney, Agent, or Firm*—Laurence R. Brown

[57] ABSTRACT

A process is described for improving the quality of images which have been formed by screen printing a liquid photo curable photopolymer. Images formed by screen printing, especially heavy coatings such as solder masks on printed wiring boards, inherently have indistinct boundaries, and may have feathered edges and photopolymer smears. These indistinct boundaries are removed and the resolution improved by a process which utilizes the oxygen inhibition effect characteristic of selected photopolymers. Thus, a screen printed image can be 0.001 inches thick at the center of a line, tapering off to 0.0001 inch thick smears, and these smears may be eliminated by irradiating the entire image with a moderate amount light energy, which cures the thick image portion and leaves a liquid boundary layer on the order of 0.0001 inch thick due to the oxygen effect. When washed with a mild solvent the liquid layer is removed, including the smears, leaving the thick image portion undisturbed. In a preferred embodiment a phototransparency is interposed over and out of contact with the images and then irradiated with non-collimated UV light so as to harden the thicker image sections while indistinct boundary areas are shielded by opaque phototransparency areas. Light undercutting due to the use of non-collimated light does not polymerize the smears because of the oxygen-inhibition effect and the thinness of the smears, and thus only the undersirable smears will be inhibited and left in the liquid state for removal to improve the resolution.

18 Claims, 3 Drawing Figures

METHOD FOR PHOTOGRAPHICALLY IMPROVING THE RESOLUTION OF SCREEN PRINTED PHOTOPOLYMER IMAGES

TECHNICAL FIELD

This disclosure relates to an improved method for manufacturing printed wiring boards; more specifically, an improved method for achieving production economies and conservation of resources in photopatterning precision relief images on the surface of printed wiring boards to serve as plating resists, etch resists, and solder masks.

BACKGROUND ART

Liquid photopolymers are used in the prior art of printed wiring board manufacture, as evidenced in my U.S. Pat. No. 4,260,675 in which a process is disclosed for preparing a glass plate phototool which carries as opaque pillars or opaque stand-offs the image of the solder mask pattern. Thus, a solder mask insulation layer is prepared by coating the board overall with a thin layer of liquid photopolymer, e.g., by screen printing using a mesh fabric without a stencil, and placing the glass plate phototool onto the board in register so that the opaque pillars register correctly with the land areas and are firmly embedded in the liquid photopolymer, so as to shield the underlying photopolymer from radiation from a UV light source. Thus, the surrounding photopolymer areas are polymerized, and transformed to a well adhered solid leaving protected area under the pillars unpolymerized and remaining in the liquid state. A solvent washout step removes unpolymerized photoresist from the printed wiring board, leaving the land areas free of solder mask and capable of receiving a coating of molten solder.

There are three features of the method of U.S. Pat. No. 4,260,675 which this disclosure seeks to improve; that is to reduce the waste of liquid photopolymer experienced when the entire board surface is coated; and to prevent the entry of liquid photoresist into drilled holes, for a considerable amount of time is required to clear the holes of resist during the washout step. The third improvement sought is the prevention of photopolymer adhering to the pillars, for after repeated exposure cycles there is a tendency for the photopolymer to bond the pillars to the board surface.

In U.S. Pat. No. 4,436,806—Rendulic et al. describes a method for producing relief images on printed wiring boards wherein a coated board is exposed through a phototransparency held above and off-contact the liquid photopolymer and exposed by collimated light directed through the transparency. Thus, while there is no contact between the transparency and the liquid photopolymer there is an inherent disadvantage in this method, for collimated light is required in order to prevent light undercutting the transparency opaque areas which would introduce intolerable loss of image fidelity. Collimated light is expensive to produce, especially the power levels required to polymerize a layer of photoresist of the order of 0.004 inches thick. Additional undesirable features are the waste of photopolymer due to coating the entire board; and the seepage of liquid resist into the holes, which requires a longer washout cycle.

A third example of prior art liquid photopolymer imaging is described in my U.S. Pat. No. 4,424,089 in which a flexible phototransparency is coated overall with a layer of liquid photopolymer then laminated onto the printed wiring board in correct register. The photopolymer is exposed to a source of uncollimated actinic light to harden light-struck photopolymer and adhere the images to the printed wiring substrate.

As with the aforedescribed current art processes, the process of U.S. Pat. No. 4,424,089 is also wasteful of photopolymer, and liquid photopolymer is forced into drilled holes, and the washout time is extended thereby.

To place in perspective the waste of time and material resources inherent in the aforedescribed processes the following waste is experienced. On a typical computer grade printed wiring board of 3 square feet area, approximately 18 grams of liquid plating photoresist is applied and approximately 9 grams are washed out in the development step, and this is wasteful.

Further, the quantity of solvent required to dissolve and remove 9 grams of photoresist is of the order of 10 times the quantity of photoresist dissolved.

Time resources for development or washout are increased by a factor of 6 when liquid photopolymer plugs drilled holes, when compared to the development time when the holes are not plugged. Thus, a one minute washout time is reduced to 10 seconds. In the current art, liquid photoresists are applied to printed wiring boards in the proper patterns by screen printing, and this conserves photoresist and does not force photopolymer into drilled holes. However, the screen printed images inherently have poor resolution, owing to indistinct boundaries and slight smears. Thus, the ability to resolve fine lines and spaces is limited to 0.010 inches in a production environment. A second advantage of screen printing photoresist images is the speed; the production rate is of the order of 5 times that of photopatterning the images.

Among the objectives of this disclosure are to improve the state of the art by a simplified higher resolution process of screen printing, particularly by reducing production time, saving photoresist materials, and improving the quality of the images so as to extend the resolution of screen printed images below the 0.010 inch line and space limitation.

DISCLOSURE OF THE INVENTION

To place the instant invention in perspective, an understanding of the characteristics of liquid photoresists is helpful. The photoresists employed in the disclosed process are of a type known as UV-curable, in that a thin layer is converted to an adhering solid by exposure to UV light energy for a period of several seconds. In most of these photopolymers, the photoinitiator responds to the UV light by generating free radicals and these free radicals cause the polymerization of the photopolymer in a time period ranging from milliseconds to several seconds. Almost all photopolymers which work by free radical photogenerating are further characterized as being oxygen inhibited, meaning that the generation of free radicals is prevented at the surface by the presence of oxygen. Thus, the amount of light energy required to polymerize surface layers is much greater when air is present than when air is excluded. Thus, when a thin layer is irradiated with a measured amount of light energy, the surface can remain liquid since oxygen quenches free radical generation at the surface, while the underlying portion adjacent to the substrate will be polymerized when light struck since no air is present there. The photopolymer thus cures from the base or substrate outward to the surface. For a given photopolymer composition it is feasible to select a light energy level and photopolymer layer thickness wherein the oxygen inhibition effect extends throughout the entire layer thickness and no photopolymerization occurs. Similarly, it is feasible to select the thickness and energy level so that all irradiated photopolymer is hard and dry. Thus, a wide range of surface characteristics and layer thickness can be obtained by controlling the light energy.

The oxygen inhibition effect is utilized in this instant disclosure as a method for eliminating the aforedescribed smears and indistinct boundaries inherent in screen printed images. In one embodiment a liquid photoresist image pattern is formed by screen printing onto a printed wiring board to a thickness of the order of 0.00075 inch, which is typically the thickness of printed wiring board plating resists. As previously described, indistinct boundaries, feathered edges and smears may be present. The thickness of these undesirable image portions is variable, but 0.0001 inch is a representative thickness. These undesirable image portions are completely removed by irradiating the entire board surface non-selectively with a moderate level of light energy so that the outer surfaces remain liquid and the thicker image portions are hardened. When subjected to a solvent washout then the unpolymerized surface layer portions are removed.

While this embodiment removes undesirable image portions, it also removes a portion of the desired image thickness for the surface of the thick images are liquid and are removed along with the smears, and this is disadvantageous.

Therefore, a preferred embodiment is disclosed which discriminates against smears, etc., without significantly reducing the thickness of wanted photopolymer areas. This preferred process includes the formation of photoresist images by screen printing, and then irradiating the images selectively through a phototransparency so as to harden the wanted areas while leaving areas to be free of resist shielded by opaque areas on the transparency. This selective exposure step is made using uncollimated light and with the transparency out of contact with the liquid images, permitting air to contact the photopolymer to reduce the surface sensitivity. Thus, the indistinct image portions shielded by the opaque areas may receive some stray light but the oxygen inhibition effects are such that the stray light is insufficient to polymerize these thin layer portions.

As previously described, the objectives of this disclosure are to reduce photopolymer waste and that objective is achieved by printing the desired pattern instead of coating all surfaces with the result that the only photopolymer waste is the minute quantity constituting the smears. The further objective of decreasing unpolymerized photoresist washout time is also achieved, for no resist enters the holes and only surface smears of 0.0001 inch are washed away.

Additionally, the disclosed process allows the useful range of screen printing to be extended beyond the current practical limit of 0.010 inches. Insofar as image placement by screen printing is much faster than the aforedescribed prior art photopatterning current art processes, this disclosed process materially reduces the cost to manufacture printed wiring boards having narrow lines and insulation spaces.

THE PREFERRED EMBODIMENTS

Figure 1:
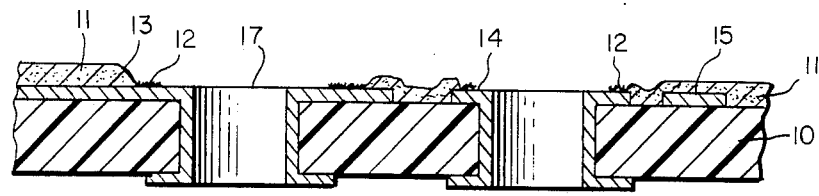
FIG. 1 is a fragmental cross section portion of a printed wiring board with a screen printed photoresist pattern shown with exaggerated thickness.
Figure 2:
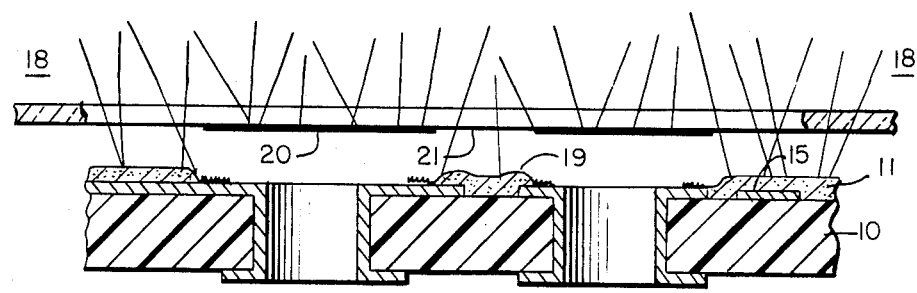
FIG. 2 shows the same cross section with smear elimination phototransparency in position over the printed wiring board.
Figure 3:
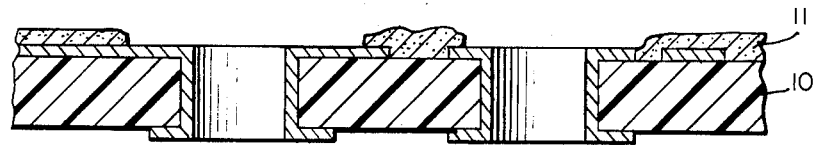
FIG. 3 shows the same cross section after solvent washout, showing the areas with smears removed.

FIGS. 1, 2 and 3 depict a section of a printed wiring board which has been screen printed with a solder mask photopolymer, FIG. 1 then irradiated through a phototransparency, FIG. 2 and FIG. 3 shows the printed wiring board after solvent washout, and illustrates how undesirable smears 12 are removed.

Base laminate 10 contains through hole 17 and metallic conductors 15 and land areas 14. Photopolymer layer 11 has been selectively applied by screen printing thereby producing indistinct boundaries as illustrated by the tapered portions 13 and smears 12. The smeared portions 12 are objectional, particularly when metallic layer 15 is copper, for if the smears are hardened then the land areas receiving solder are diminished and are diminished to an unpredictable extent and this is unacceptable.

This disclosure describes a method for removing these smears 12 cleanly, rapidly, and inexpensively. In FIG. 2 phototransparency 16 has been placed adjacent to and out of contact with photopolymer layer 11 and the assembly is irradiated with non-collimated light energy 18. Where photopolymer layer 11 is thick, as over conductor 15 then that thick layer is polymerized outward from the top of trace 15 toward the surface facing transparency 16 thereby producing a hardened portion well adhered to conductor 15, base laminate 10, and resistant to a mild solvent. The outer surface of layer 11 underlying transparency clear areas 21 may remain in the liquid state or the surface may be irradiated with sufficient energy so as to produce a dry surface, but typically the thickness of the liquid layer portion will be much less than the thickness of the smears 12, and this liquid surface layer will be developed out in the solvent washout step along with smears 12.

As described earlier, the small amount of light energy reaching the smears 12 is insufficient to effect polymerization, for the light intensity, exposure time, and photo properties of layer 11 are selected so that with a given smear thickness no polymerization occurs which would inhibit washout in a mild solvent.

As aforedescribed, the smears 12 can be effectively removed by irradiating the entire board surface of FIG. 1 non-selectively with a predetermined amount of light energy, leaving the surface layer including smears 12 unpolymerized and thicker sections 11 hardened from the substrate outward, but this is not the preferred embodiment since a thick smear may be inadvertently hardened and adhered to substrate 10. The use of transparency 16 of FIG. 2 is preferred so that a greater amount of light energy can be directed onto the pattern areas to be completely polymerized than received inadvertently by the smears over the land areas through dispersion of uncollimated light.

While the preferred embodiment shown in the drawings depicts smear removal of solder mask photoresist, the same process can be followed to remove smears from primary imaging photo resists which have been screen printed, including plating and etch resists and board marking images.

In addition to smear removal, the disclosed process offers a surprising advantage when used with solder mask photopolymers. Most solder mask photopolymers produce a hard glossy exterior surface when screen printed and cured with a high intensity UV light source. This glossy surface to which liquid polymer marking ink may be applied is non-adhering and the marking ink may not form a firm bond. When the same board is processed in accordance with this disclosed process then the solder mask surface can be left with a matte surface, for when a very thin surface layer is left unpolymerized the solvent washout step leaves the surface matte and thus provides a well adhering surface to which marking ink adheres well.

While the preferred embodiment is directed toward the placement of liquid photoresists on printed wiring boards, there are additional applications which fall within the spirit and intent of this disclosure.

As one example, electrical conductors are formed in the prior art by screen printing a liquid photopolymer containing metallic silver particles in the desired conductor pattern, then transforming the liquid images into electrical conductors by irradiating with a strong UV light source. Thus, as previously described, these screen printed images are also characterized as having smears and indistinct boundaries. These low resolution conductor images can be processed in accordance with this disclosed process in order to remove the smears and thereby improve resolution, with slight loss of silver particles in the washout step, and conductor density is thereby improved.

A second example of additional applications is the improvement of print quality of graphic data such as front panel marking, or other substrates where the desired characters are formed rapidly in an approximate pattern, and then corrected photographically.

Thus, with the present invention it is possible to improve the resolution of printed characters which are formed from photopolymers and may have low resolution because of the tendency to smear or run at the pattern edges. This is achieved by means of the oxygen inhibited characteristic of selected polymers that will leave the surface coating in liquid form to a predetermined depth when photoexposed in the presence of air with a controlled predetermined amount of radiation energy. Photoexposure of the printed patterns with inexpensive uncollimated radiation then polymerizes a substantial thickness of the primary pattern areas from the substrate outward thereby adhering to the substrate and resisting solvency in at least mild solvents which can remove the liquid layer at the surface. Thus, the smears are readily removed to leave only the primary pattern without a tendency to reduce any conductive land areas on a printed circuit board, for example, where the pattern is a solder mask. Similarly the reduction of conductor line widths in primary imaging is provided for better reliability, etc.

This section shows six examples of how the disclosed process can be used in the manufacture of printed wiring boards and imaging other substrates.

EXAMPLE 1

Printed wiring board solder masks are formed using the disclosure process wherein a master phototransparency defines areas to receive solder mask as clear images on a opaque field. A stencil is formed on a stainless steel fabric using the master phototransparency, and a reverse image is formed on a glass plate so as to give opaque image areas on a clear field. The preferred photopolymer is available from M&T CHEMICALS, INC., Type 320 Solder Mask Photopolymer. The solder mask is then screen printed through the stencil onto printed wiring boards in sequence, and after several impressions some smearing of photopolymer may be experienced. These smears are removed by registering the glass plate over the printed wiring board, off-contact such that printed image areas are not contacted by the glass plate emulsion patterns; an off-contact distance of 0.005 inches is adequate.

Desired image portions are polymerized by exposure to a non-collimated UV light source. One acceptable source the DMVL is manufactured by COLIGHT, INC. A 45 second exposure time with a 1 kw lamp under the stated conditions will polymerize the thicker image portions from the base laminate outward, producing a hardened inner layer of the order of 0.0009 inches thick and an unhardened outer portion of the order of 0.0001 inch thick. Smears and other printed portions which were shielded by glass plate opaque areas are still liquid and are washed away in a semi-aqueous solution containing 20 percent Butyl Cellosolve. A final and complete polymerization step is accomplished by conveying the substrate under a high intensity mercury vapor lamp rated at 200 watts per inch at a speed of 8 feet per minute.

EXAMPLE 2

Board marking or nomenclaturing is accomplished by following the steps of Example 1 but using a photopolymer including an ink specifically formulated for board marking. One suitable photopolymer is the SERIES 900 LEGEND INKS manufactured by M&T CHEMICALS, INC.

EXAMPLE 3

The disclosed process can be used to extend the useful range of screen printed primary images on the metallic surface of a printed wiring board superimposed on an insulating panel, which are resist images defining the conductor lines and insulation space patterns. Thus, smears in an etch resist layer which could cause bridged circuitry are removed by selective irradiation which discriminates against the thinner liquid layer portions shielded by the phototransparency opaque areas. One suitable etch resist photopolymer is the type 825 manufactured by M&T CHEMICALS, INC. The steps of Example 1 are followed.

EXAMPLE 4

Electrical conductors are formed on a substrate with an insulation surface in the prior art by screen printing a conductive photopolymer, such as silver filled, in the conductor patterns and hardening the photopolymer by exposure to a strong UV light source. The aforedescribed smears and indistinct boundaries characterize these screen printed conductors and the instant method can be used to remove the smears and produce well-defined lines. One suitable silver filled photopolymer is manufactured by W. R. GRACE COMPANY and sold as product F-1782. The steps of Example 1 are followed to remove the indistinct boundaries.

EXAMPLE 5

Graphic images are formed on substrates which need not be related to printed wiring, such as meter faces, front panels, etc. using the process as in Example 1, and using a photopolymer such as the UV20-30 as made by the COLONIAL PRINTING INK COMPANY.

EXAMPLE 6

The disclosed process can be used with photopolymers which are not polymerized by free radical photoinitiation but are instead photo polymerized by light induced acid species. The latter type of photopolymers are known collectively as cationic UV epoxies, and these UV epoxies are not typically oxygen inhibited, and the photohardening process produces a dry surface on exposure to UV light. One suitable photopolymer is sold by UNION CARBIDE as UVR-6100 and this photopolymer can be used in accordance with this disclosed process as in Example 1. Insofar as the cationic photopolymers are not oxygen inhibited then there may be some photopolymer hardening on areas shielded by the phototransparency due to the non-collimated light rays undercutting the opaque areas, and the degree of improvement in image fidelity may not be as great as when free radical photoinitiators are used.

I claim:

1. The process of improving resolution of printed photopolymer patterns of low resolution because of smears at the pattern edges, comprising the steps of:
   printing on a substrate surface a pattern of photopolymer with an oxygen inhibited characteristic that leaves the surface in liquid form to a predetermined depth when photoexposed in the presence of air with a predetermined amount of radiation energy, wherein the printing leaves a low resolution pattern with smears of substantially reduced thickness from that of the polymer thickness of the pattern appearing at edge portions of the pattern,
   photoexposing the polymer pattern with the surface in contact with air to radiation of such energy that the smears are left in liquid form while polymerizing at least a substantial thickness of the polymer defining the pattern to adhere to the substrate and resist solvency to a predetermined solvent that will remove the liquid form smears of the polymer, and
   removing the liquid form smears with said solvent in a development step thereby to increase the resolution of the remaining polymerized pattern.

2. The process defined in claim 1 including the further steps of:
   photoexposing the entire pattern and smear surface with said photoexposing step to leave the surface of the pattern in liquid form to said predetermined depth, and
   removing the liquid polymer from the pattern surface with the development step removing the smears.

3. The process defined in claim 1 including the further step of:
   photoexposing the polymer pattern in said photoexposing step through a phototransparency separated from the polymer pattern by an air gap and registering a desired photopattern over the screen printed pattern having smear areas blocked from radiation by opaque portions of the phototransparency with sufficient radiation energy to polymerize the desired pattern throughout the depth of the polymer while leaving smears at the edges of the desired pattern in liquid form for removal in the development step.

4. Producing a printed wiring board by the process of claim 1 including the step of:
   printing said pattern over conductors placed on a printed wiring board comprising said substrate.

5. The process defined in claim 4 wherein the substrate has through holes, including the step of printing the pattern to avoid deposit of the polymer in the through holes.

6. The method of forming patterns of good resolution upon a substrate with liquid photopolymers of the type that oxygen inhibits polymerization, comprising the steps of:
   screen printing a poor resolution pattern of the liquid photopolymer on a substrate having smears of liquid photopolymer at the edge portions of the pattern, and
   photoexposing the printed pattern with its polymer exposed to air to radiation of such limited energy that thin edges and surface smears are left in the liquid polymer form while the primary pattern is polymerized to a significant depth from or the substrate outward.

7. The method of claim 6 including the more detailed photoexposing step of photoexposing through a phototransparency separated by an air gap from the printed pattern surface to polymerize the polymer substantially only in the pattern defined by the phototransparency.

8. A process for curing a liquid photopolymer including the steps of, depositing a layer of liquid photopolymer on a substrate, irradiating the layer with a predetermined amount of radiant energy that hardens substantially the entire layer thickness except for a thin surface layer portion, and removing the unhardened surface portion.

9. The process defined in claim 8 including the step of adding a layer of liquid photopolymer onto the hardened layer after the unhardened surface portion is removed thereby providing a firm bond between layers by means of the textured matte surface left by the irradiation step.

10. A process for removing excess portions of liquid photopolymer patterns previously placed on a substrate surface by a screen printing step thus leaving low resolution smears at the edges of the pattern, including the steps of, depositing said liquid photopolymer patterns on the substrate surface, irradiating the photopolymer pattern through a phototransparency spaced from the photopolymer pattern surface with a transparent image thereon defining a high resolution pattern within the confines of the photopolymer pattern on the surface, transmitting radiation through the image to harden the photopolymer in a high resolution pattern leaving the smears in unhardened liquid form, and removing the unhardened portions of the photopolymer pattern after radiation to produce a high resolution pattern on the substrate surface.

11. The process of claim 10 wherein the photopolymer is a cationic polymer.

12. The process of claim 10 wherein the substrate is a printed wiring board and the photopolymer a solder mask resist.

13. The process of claim 10 including the revised step of depositing the photopolymer pattern through a stainless steel fabric stencil.

14. The process of claim 10 wherein the photopolymer includes board marking ink.

15. The process of claim 10 wherein the substrate is a printed wiring board with a metallic surface on an insulating panel, and the depositing step pattern and the transparent image defines a pattern of desired conductor lines and spaces.

16. The process of claim 10 wherein the substrate has an insulating surface, and the photopolymer comprises a conductive material.

17. The product obtained from the process of claim 10.

18. The process of claim 1, including the more detailed printing step of forming photoresist images on the substrate by screen printing.

* * * * *